United States Patent [19]

Gabillard et al.

[11] Patent Number: 4,916,663

[45] Date of Patent: Apr. 10, 1990

[54] FAST-ACCESS DATA STORAGE CIRCUIT HAVING A TWO-DIMENSIONAL CARRIER GAS

[75] Inventors: Bertrand Gabillard; Jean-Noël Patillon, both of Paris, France

[73] Assignee: U.S. Philips Corp., New York, N.Y.

[21] Appl. No.: 157,544

[22] Filed: Feb. 17, 1988

[30] Foreign Application Priority Data

Feb. 20, 1987 [FR] France ................................ 87 02232

[51] Int. Cl.$^4$ .............................................. G11C 11/44
[52] U.S. Cl. .................................... 365/161; 365/160; 505/831; 505/833
[58] Field of Search .............. 365/160, 161, 162, 831, 365/833, 834; 357/5, 27

[56] References Cited

U.S. PATENT DOCUMENTS 4,167,791   9/1979   Banavar et al. ..................... 365/160

Primary Examiner—Terrell W. Fears
Attorney, Agent, or Firm—Steven R. Biren

[57] ABSTRACT

This fast-access data storage circuit is made of a semiconductor material with a two-dimensional carrier gas between two of its layers. The material is rendered superconducting by a suitable choice of the temperature and magnetic field conditions. The circuit is formed by a plurality of memory cells, each of which is formed by two selection transistors, a semiconductor loop, ohmic contacts and a grid which is arranged on the loop and one of the contacts. The superconductivity reduces the access time. One selection controls the reading of data or the writing of a state "1" in the loop, while the other selection transistor controls the cancellation of the data and hence the writing of a state "0" by means of the grid arranged on the loop.

3 Claims, 3 Drawing Sheets

FAST-ACCESS DATA STORAGE CIRCUIT HAVING A TWO-DIMENSIONAL CARRIER GAS

BACKGROUND OF THE INVENTION

The invention relates to a fast-access monolithic integrated data storage circuit on a semi-insulating substrate.

A fast-access data storage circuit is described in "IEEE Transactions on Electron Devices", Vol. ED-33, No. 1, January 1986, pages 104 to 110. A last circuit of this kind is constructed as a matrix of memory points which are interconnected by means of interconnection lines. The matrix of memory points is divided in two in order to divide the length of these access lines to the memory points in two, thus reducing the signal propagation time approximately by a factor 4. With an access line there are associated a resistor R and a capacitor C, both of which depend on the length of the line, so that the time constant RC is substantially a function of the square of the length; thus, by dividing the length of the line by 2, the propagation time is divided by 4. The propagation time could thus be further reduced by a few orders of magnitude by dividing the matrix of memory points, for example, into four sections, but this method is not satisfactory in the case of ultrafast data signals, for example, in the case of applications involving a super-computer operating at speeds in the order of from 100 to 1000 MIPS (Mega Instructions Per Second). A major drawback of the use of such a method is that the propagation time is no longer negligibly small with respect to the positive-going edge of the signals which are subject to a delay, are distorted and are no longer reproduced so as to be identical on the output of the circuit.

SUMMARY OF THE INVENTION

It is the object of the present invention to provide an adequate solution to the above drawback.

To achieve this, the fast-access data storage circuit of the kind set forth above is characterized in that it is made of a semiconductor material with a two-dimensional electronic carrier gas, which semiconductor material is formed by the stacking of layers of a material having a narrow forbidden band and a material having a wider forbidden band (or vice versa), the two-dimensional gas being present at the interface of these two layers, in which circuit said semiconductor material becomes superconducting when the temperature and the magnetic field are suitably chosen, resulting in an extreme reduction of the access time of said circuit and ensuring a quasi-unlimited conservation of the data stored. Thus, in given temperature and magnetic field conditions, the material of the circuit becomes a superconductor; the conductivity being quasi-ideal, the signals can propagate substantially at the speed of light in the medium concerned. As a result, the delays and distortions of the fast signals which are observed during their propagation in conventional circuits are quasi-suppressed and appropriate signals are obtained on the output of the circuits operating in accordance with of the present invention; the data stored are also ideally conserved and sustained, as will appear from the following description.

The data storage circuit is thus formed by means of a matrix of memory points, also referred to as memory cells, in order to form, for example, a monolithic integrated static random access memory.

In a preferred but non-limitative embodiment, a memory cell of the data storage circuit is formed by two selection transistors, a semiconductor loop, ohmic contacts, one of which is arranged at the center of the loop while the others are arranged outside the loop, two of the latter ohmic contacts being in contact with the loop, and by a grid which is arranged on the loop.

The loop becomes a semiconductor as a result of the presence of a two-dimensional electron gas confined between two layers.

At low temperatures (for example, 4.2° K.) and for given high values of the magnetic field (for example, 7 T) applied perpendicularly to the loop, superconductivity is observed in the semiconductor layer.

The invention involves the use of the quantified Hall effect either for injecting a current into the loop via two contacts, or for collecting (or not) the Hall voltage between these two contacts when a current circulates (or not) in the loop, the current constituting the data element while the loop constitutes the storage element. An effect of this kind is described in detail in a number of works or publications, for example "Surface Science 142" (Elsevier, 1984), by H.L. Stormer, Novel Physics in two dimensions, pages 130 to 146, notably section 3-2 on page 136 while prior-art Hall effect switching devices are shown in U.S. Pat. No. 4,488,164.

BRIEF DESCRIPTION OF THE DRAWING

The invention will be better understood on the basis of the following description which is given, by way of example, with reference to the accompanying drawing. In the drawing.

DESCRIPTION OF THE PREFERRED EMBODIMENTS

Figure 1:
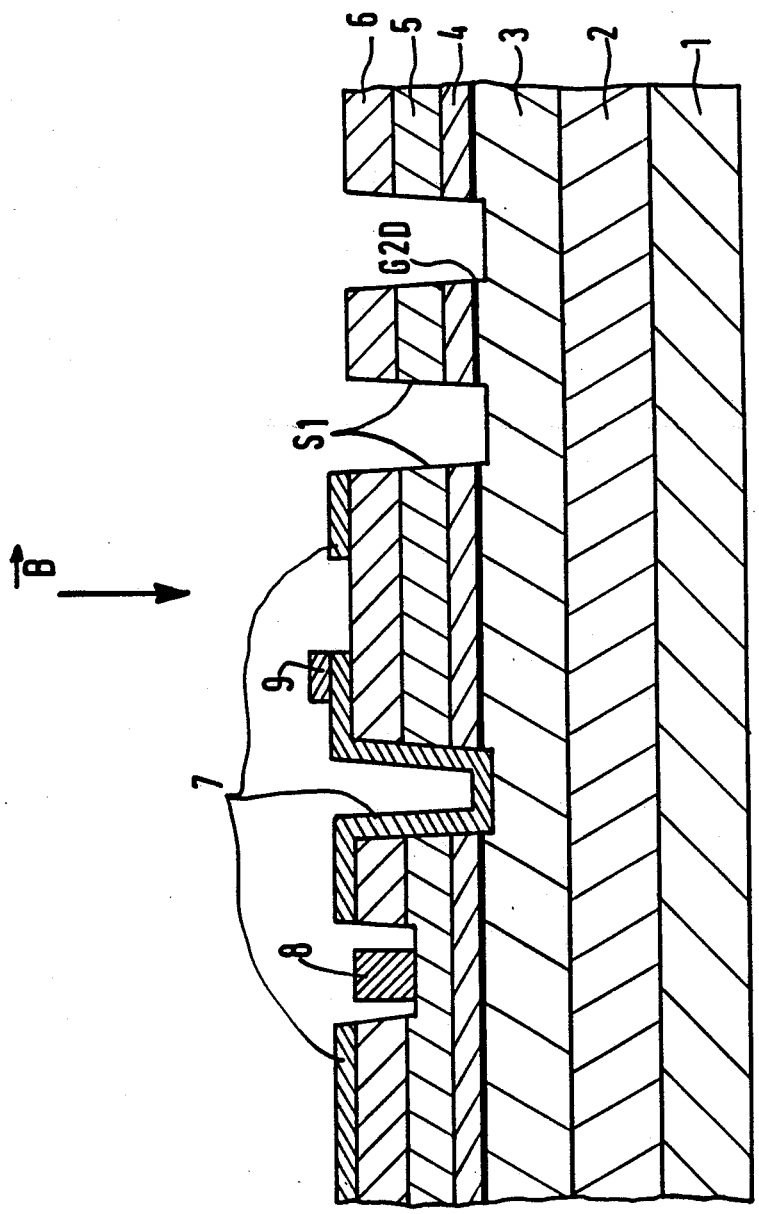
FIG. 1 is a cross-sectional view of a feasible structure of a memory cell.
Figure 3:
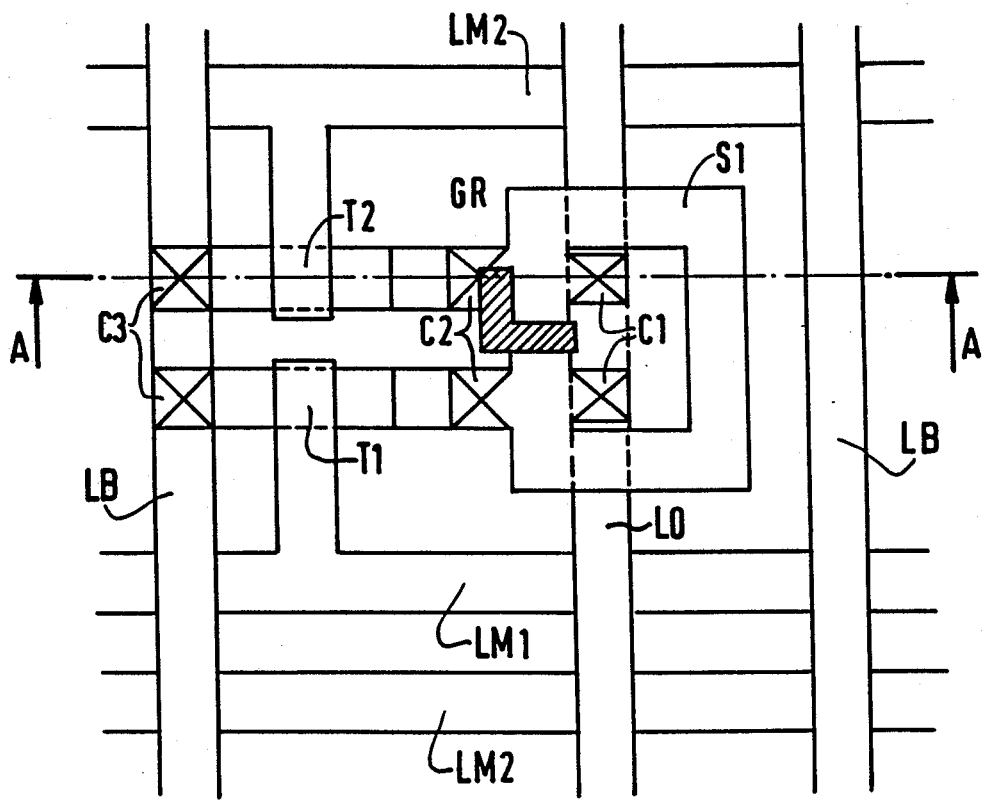
FIG. 3 shows a technological realization of a memory cell.

FIG. 1 shows one of the feasible epitaxial structures of a memory cell in a cross-sectional view, notably taken along the line AA in FIG. 3. In accordance with the invention, the material necessary for realizing the circuit must present a two-dimensional electronic carrier gas (electrons or holes) and is formed by the stacking of layers of a material having a narrow forbidden band and a material having a wider forbidden band (or vice versa). The two-dimensional gas is present at the interface of these two layers, the presence of the gas making the material a semiconductor. A large variety of materials, especially III–V materials (Particularly suitable for this application) including their ternary and quaternary alloys, permit a large number of combinations of the said materials. According to a preferred embodiment of the circuit in accordance with the invention, the choice is made for a combination of the type AlOaAs/GaAs. However, it is quite clear that this choice is not limitative; other combinations could also be very suitable.

Once the material has been chosen, the epitaxial structure is obtained on a layer 1 of semi-insulating chromium-doped GaAs; it is constituted by a layer 2 of undoped AlGaAs having a thickness L2 (0.5 $\mu m \leq L2 \leq 1\ \mu m$), by a layer 3 of undoped GaAs having a thickness L3 (0.5 $\mu m \leq L3 \leq 1\ \mu m$), a thin layer 4 of undoped AlGaAs having a thickness L4 (20 Å $\leq L4 \leq 100$ Å), by a layer 5 of silicon-doped AlGaAs having a thickness L5 (50 Å $\leq L5 \leq 500$ Å, $N_{D5} \approx 10^{18}$ cm$^{-3}$), and finally by a layer 6 of silicon-doped GaAs having a thickness L6 (50 Å $\leq L6 \leq 500$ Å, $N_{D6} \approx 10^{18}$ cm$^{-3}$). The two-dimensional gas denoted by the reference 2DG, is located at the heterojunction of the layers 3 and 4. The thicknesses of the layers 4 and 5 and the doping of the layer 5 are chosen so that the electron density $n_{2D}$ of the two-dimensional gas is of the order of $3.10^{11}$ cm$^{-2}$.

This electron density corresponds to the formation of the Hall Plateau corresponding to the second Landau sublevel of the two-dimensional gas for a magnetic field B, the induction of which is less than 7 T (the magnetic field being applied perpendicularly to the plane of the circuit, see FIG. 1). It will be obvious that the present invention may extend to higher gas concentrations and to Hall plateaus obtained at stronger magnetic fields.

On the other hand, in order to obtain the desired superconductivity in combination with the other characteristics, the temperature is kept low. In the chosen embodiment, it was of the order of a few °K (4.2° K.).

The layer 7 comprises a metallization, for example, of AuGeNi and covers part of the loop (denoted by S1). The loop is insulated from the remainder of the two-dimensional layer by chemical etching of the layers 4, 5, 6. The present invention can be extended to other types of insulation, for example, an insulation obtained by boron implantation.

The field effect selection transistors are of the type HEMT. They are separated from the loop either by chemical etching or by implantation. The HEMT transistors are obtained on the same epitaxial layers by deposition of a Schottky metallization 8 on the layer 5 for the grid, the metallization 7 providing the two ohmic drain and source contacts on the layer 6.

One of the characteristics of the invention is that for each of the memory cells one of the ohmic contacts situated against and outside the loop is also connected to the grid provided on the loop in order to enable, if desired, the disturbing of the two-dimensional electron gas, thus causing instantaneous disappearance of the superconducting properties of the semiconductor material. Actually, the grid 9 is arranged on the metallization 7, connecting the source of the transistor T2 (see FIG. 3) to the contact C2 (FIG. 3) situated against and outside the loop S1, and on the loop S1. The grid 9 in FIG. 1 is shown in cross-section according to the line AA of FIG. 3, but appears in its entirety in plane view in FIG. 3. The grid 9 is made of, for example, Tipt.

Figure 2:
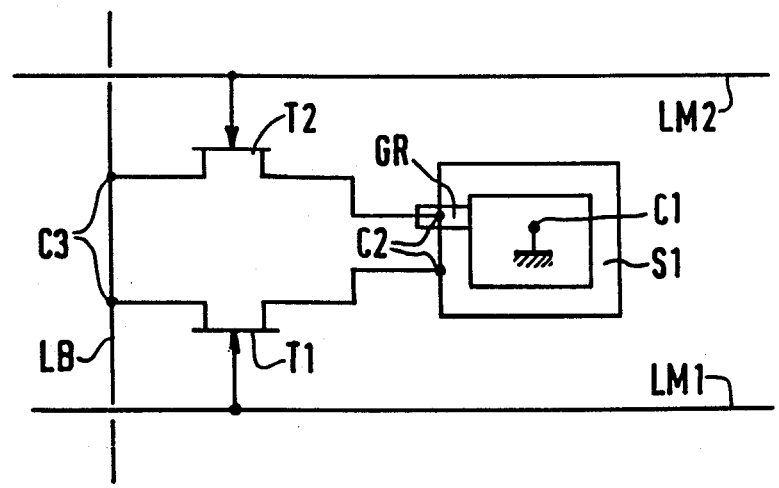
FIG. 2 shows an electrical diagram of a memory cell.

FIG. 2 shows an electrical diagram of a memory cell. In accordance with the invention, the memory cell is formed by a semiconductor loop S1 whose center is connected to ground via ohmic contacts C1. Two contacts C2 are situated against but outside the loop. The memory cell also comprises two selection transistors T1 and T2 which are controlled by the address signals transported by word lines LM1 and LM2, respectively. The sources of the transistors T1, T2 are connected to the contacts C2, the drains of T1 and T2 being connected to a bit line LB via contacts C3. Finally, a grid GR is arranged on the loop S1; it is also connected to the source of the transistor T2 via the contact C2 on Which it is deposited.

FIG. 3 is a detailed graphic representation of a technological realization of a memory cell. The formation of a memory cell requires a substantially square surface of slightly more than 100 $\mu m^2$.

The common elements of the Figs. 2 and 3 are denoted by corresponding reference numerals.

The memory function is realized by way of the presence or absence of a current in the loop S1:

the state "1" corresponds to the presence of a current;
the state "0" corresponds to the absence of a current.

A current is formed as follows. The magnetic field B being independent of the time, a positive voltage V8 of 1 V is applied on the bit line LB, a positive voltage VM1 of 1 V also being applied on the Word line LM1, so that the transistor T1 is turned on. A current I will then be formed between the bid line LB and the ohmic contact C1 which is conceived to the ground line LO and which is situated opposite the ohmic contact C2 which itself is in contact with the source of the transistor T1. Because the loop is a superconductor in the presence of the magnetic field and a low temperature, the current I will be formed and trapped in the loop. As it is trapped in the loop, the current I will be sustained even when the voltages VB and VM1 become zero. This is the superconductivity effect which allows for continued existence of the current I.

The current I is cancelled as follows. A positive voltage VGR of 1 V is applied to the grid GR via the contact C2 which is connected to the source of the transistor T2 which is then turned on. This positive voltage disturbs the two-dimensional electron gas and causes the superconducting properties of this gas to disappear instantaneously, thus causing the disappearance of the superconducting current 1.

Figure 4:
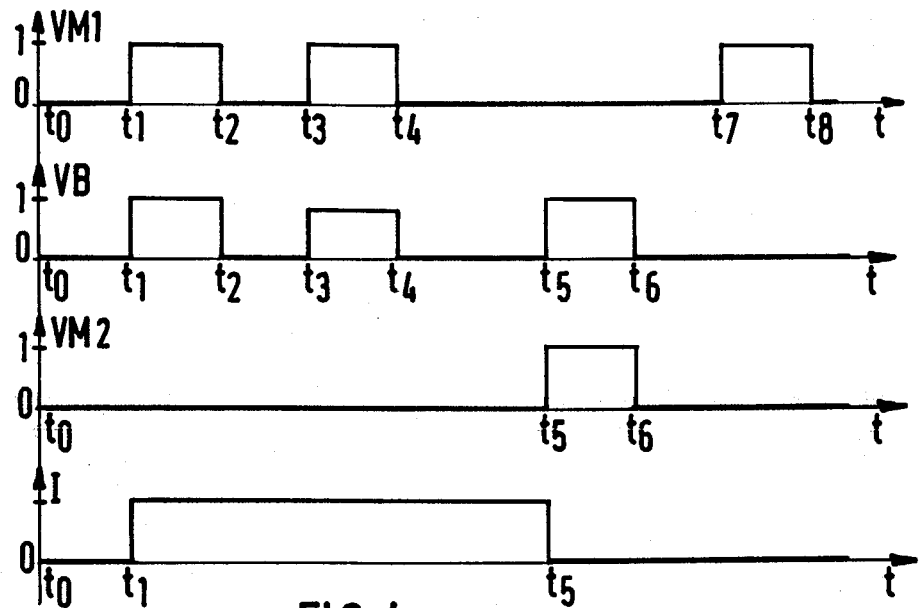
FIG. 4 shows the control signals for the memory cell as a function of time.

FIG. 4 shows the control signals for the memory cell as a function of time.

The time diagram illustrates a write cycle for a state "1", followed by a read cycle for this state "1", which itself is followed by a write cycle for a state "0" and finally by a read cycle for a state "0".

At the instant t0, the cell is not addressed and its state is "0" because the current I is zero.

At the instant t1, a potential VM1=V1 is applied to the word line LM1. A potential VB=1 V is applied to the bit line LB. The write cycle commences and a current I appears and circulates in the loop.

At the instant t2, a potential VM1 =0 V is applied to the word line LM1. A potential VB =0 V is applied to the bit line LB. The current I continues to circulate in the loop. The write cycle is terminated.

At the instant t3, a potential VM1=1 V is applied to the word line LM1. The bit line LB carries a potential VB$\approx$0.8 V. The write cycle commences and the Hall voltage VB appears on the bit line LB. The current I continues to circulate in the loop.

At the instant t4, a potential VM1=0 V is applied to the word line LM1. The bit line LB carries a potential VB which decreases to 0V. The write cycle is terminated and the Hall voltage VB on the bit line LB disappears. The current I continues to circulate in the loop.

At the instant t5, a potential VM2=1 V is applied to the word line LM2. A potential VB=1 V is applied to the bit line LB. The write cycle commences and the current I in the loop becomes zero, because the grid potential GR becomes VGR=1 V which disturbs the two-dimensional electron gas and causes the disappearance of the semi-conducting properties of the gas during this period, thus causing the disappearance of I which is eliminated by the Joule effect because a resistive material is involved.

At the instant t6, a potential VM2=0 V is applied to the word line LM2. A potential VB=0 V is applied to the bit line LB. The write cycle is terminated and the current I in the loop is still zero.

At the instant t7, a potential VM1=1 V is applied to the word line LM1. The bit line LB carries a potential VB=0 V. The write cycle commences. The Hall voltage VB is zero and the current I is zero.

At the instant t8, a potential VM1=0 V is applied to the word line LM1. The bit line LB still carries a potential VB which is Zelo. The write cycle is terminated and the current 1 is still Zero.

Figure 5:
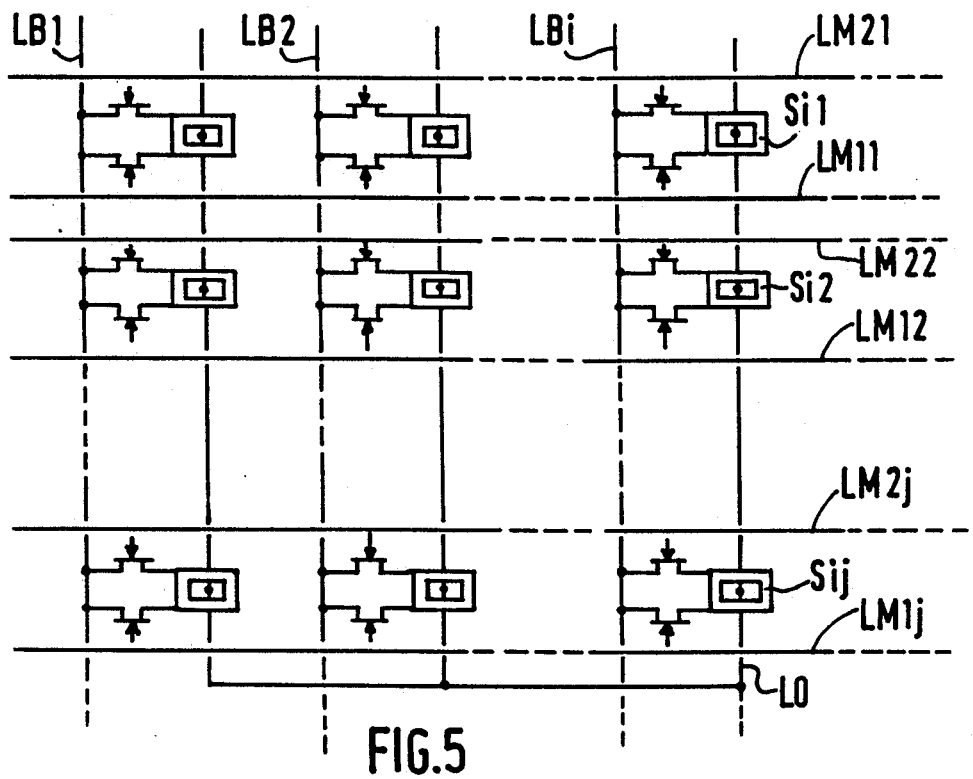
FIG. 5 shows a matrix arrangement of a number of memory cells.

FIG. 5 shows a matrix arrangement of a group of memory cells enabling the formation of a static random access memory.

The memory cells Mij are organized in the form of a network of cells having a matrix structure. Each cell (M11, M21, ... Mi1, ... M12, M22, ... Mi2, ..., M1j, M2j, ..., Mij, ...) corresponds to a digital number and is situated at the intersection of two lines: a horizontal line or row (i) and a vertical line or column (j). Thus, each cell of the memory as a unique address and can be addressed by the simultaneous activation of the appropriate row and column.

This selection is performed by way of decoder circuits whose inputs receive the binary coded memory addresses and whose outputs or word lines LM1j or LM2j control the access to the memory cells.

After selection of the memory cell, data can be extracted therefrom or can be applied thereto via a bit line L8i which is common to all cells of the same memory column. The central ohmic contacts of the loops Si1, Si2, ... Sij, ... of the same memory column are interconnected by way of a ground line LO which is insulated from each loop by a dielectric. The contact between the line LO and each central ohmic contact (C1, see FIG. 2) of the loop is realized by way of a hole in the dielectric which insulates the word lines LM1j, LM2j and the bit lines LBI and the ground lines LO.

The word lines LM1j are used in the write mode in the states "1" and "0" or in the write mode in a state "1" (formation of the current I).

The word lines LM2j are used exclusively in the write in a state "0" (cancellation of the current I).

The bit lines LBI are used in the write mode or the read mode.

The lines LM1j, LM2j, LBi are selected in a conventional manner by means of address decoder circuits.

It will be evident that the use of the invention in memories realized by means of field effect transistors integrated on a GaAs substrate is non-limitative and that many alternatives are feasible, notably as regards the size, the characteristics and the voltages of the control lines, without departing from the scope of the present invention.

The invention is particularly attractively used in novel applications, notably for a supercomputer where it naturally finds the environment (magnetic field, low temperatures) necessary for obtaining superconductivity.

What is claimed is:

1. A fast-access monolythic integrated data storage circuit on a semi-insulating substrate, characterized in that it comprises a semiconductor material with a two-dimensional electronic carrier gas, which semiconductor material is formed by adjacent layers of a material having a narrow forbidden band and a material having a wider forbidden band, the two-dimensional gas being located at the interface of these two layers, in which circuit said semiconductor material becomes superconducting when the temperature and the magnetic field are suitably chosen, resulting in an extreme reduction of the access time of said circuit and ensuring a quasi-unlimited conservation of the data stored.

2. A fast-access data storage circuit as claimed in claim 1, which comprises a plurality of memory cells, characterized in that each memory cell is formed by two selection transistors, a semiconductor loop, ohmic contacts, two of which are arranged at the center of the loop while the remaining contacts are arranged outside the loop, two of the latter ohmic contacts being in contact with the loop, and by a grid which is arranged on the loop.

3. A fast-access data storage circuit as claimed in claim 1 or 2, characterized in that for each of the memory cells one of the two contacts situated in contact with and outside the loop is also connected to the grid arranged on the loop in order to enable, when desired, the disturbing of the two-dimensional electron gas, thus causing instantaneous cancellation of the superconducting properties of the semiconductor material.

* * * * *